United States Patent
Lee et al.

(10) Patent No.: US 8,254,164 B2
(45) Date of Patent: Aug. 28, 2012

(54) SEMICONDUCTOR DEVICE USING MAGNETIC DOMAIN WALL MOVEMENT

(75) Inventors: Sung-chul Lee, Osan-si (KR); Kwang-seok Kim, Seongnam-si (KR); Ung-hwan Pi, Seoul (KR); Ji-young Bae, Seongnam-si (KR); Sun-ae Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 179 days.

(21) Appl. No.: 12/289,484

(22) Filed: Oct. 29, 2008

(65) Prior Publication Data

US 2009/0109740 A1    Apr. 30, 2009

(30) Foreign Application Priority Data

Oct. 29, 2007  (KR) .................. 10-2007-0109157

(51) Int. Cl.
*G11C 11/14*  (2006.01)
*H01L 43/02*  (2006.01)
(52) U.S. Cl. ............... 365/171; 257/421; 257/E43.001

(58) Field of Classification Search ............... 365/80, 365/87, 158, 171, 173; 438/3
See application file for complete search history.

(56) References Cited

U.S. PATENT DOCUMENTS

| | | | |
|---|---|---|---|
| 2005/0078509 A1* | 4/2005 | Parkin | 365/158 |
| 2007/0087454 A1* | 4/2007 | Chen et al. | 438/3 |
| 2007/0195588 A1* | 8/2007 | Kim et al. | 365/158 |

FOREIGN PATENT DOCUMENTS

| | | |
|---|---|---|
| JP | 2000-268980 | 9/2000 |
| KR | 10-2004-0107348 | 12/2004 |
| KR | 10-2005-0005351 | 1/2005 |

* cited by examiner

*Primary Examiner* — Hoai V Ho
*Assistant Examiner* — James G Norman
(74) *Attorney, Agent, or Firm* — Harness, Dickey & Pierce, P.L.C.

(57) ABSTRACT

Provided may be a semiconductor device using magnetic domain wall movement. The semiconductor device may include a magnetic track having a plurality of magnetic domains and a thermal conductive insulating layer configured to contact the magnetic track. The thermal conductive insulating layer may prevent or reduce the magnetic track from being heated due to a current supplied to the magnetic track.

20 Claims, 3 Drawing Sheets

SEMICONDUCTOR DEVICE USING MAGNETIC DOMAIN WALL MOVEMENT

PRIORITY STATEMENT

This application claims priority under U.S.C. §119 to Korean Patent Application No. 10-2007-0109157, filed on Oct. 29, 2007, in the Korean Intellectual Property Office (KIPO), the entire contents of which are incorporated herein by reference.

BACKGROUND

1. Field

Example embodiments relate to a semiconductor device using magnetic domain wall movement.

2. Description of the Related Art

A flash memory is a non-volatile memory that has been widely used in various applications. The flash memory, however, has relatively low operating speed and a relatively short lifetime. To overcome such problems, new types of memory have been introduced, e.g., a magnetic random access memory (MRAM), a ferroelectric random access memory (FRAM), a phase-change random access memory (PRAM), and a resistive random access memory (RRAM). However, because these new memories include switching elements connected to respective memory cells, increasing a degree of integration may be difficult.

Thus, an information storage device using magnetic domain wall movement has been introduced. This information storage device may be a non-volatile information storage device in which a switching element is not required to be connected to a memory cell.

A minute magnetic region that constitutes a magnetic body may be referred to as a magnetic domain. The direction of magnetic moments in a magnetic domain may be identical. A magnetic domain wall may be a boundary portion between magnetic domains having different magnetization directions. The magnetic domains and the magnetic domain walls may be moved within a magnetic body by supplying current to the magnetic body. By using the principle of movement of magnetic domains and the magnetic domain walls, embodying a non-volatile information storage device that does not need a switching element for controlling access to a memory cell may be possible.

However, semiconductor devices using magnetic domain wall movement may be still at an early stage of development, and several problems need to be overcome so that they may be put to practical use. For example, continuously supplying a pulse current with a density of about $10^9$ to about $10^{12}$ A/m$^2$ may be supplied to a magnetic body in order to move magnetic domains and magnetic domain walls, but the magnetic body becomes heated due to the pulse current, thereby causing various problems. If the magnetic body becomes heated, the retention of information recorded on the magnetic domains thereof may be degraded and the shape of the magnetic body may deform.

Also, as the temperature of the magnetic body is increased, the electrical resistance of the magnetic body may also be increased, and thus, an increased voltage should be applied to the magnetic body in order to supply the same amount of current. Furthermore, the moving speed of the magnetic domain walls and the threshold density of current necessary to movement of the magnetic domain walls vary according to the temperature of the magnetic body. Accordingly, controlling an information storage device using magnetic domain wall movement and securing the reliability thereof may be difficult.

SUMMARY

Example embodiments provide a semiconductor device using magnetic domain wall movement. Additional aspects will be set forth in part in the description which follows and, in part, will be apparent from the description, or may be learned by practice of example embodiments.

According to example embodiments, a semiconductor device may include a magnetic track having a plurality of magnetic domains, where a magnetic domain wall may be preset between adjacent magnetic domains; a current supply unit configured to supply current to the magnetic tracks to move the magnetic domains and the magnetic domain walls; and a thermal conductive insulating layer configured to contact the magnetic track.

Thermal conductivity k of the thermal conductive insulating layer may be about $10 \leq k \leq 2000$ J/(s·m·K). The thermal conductive insulating layer may be formed of at least one chosen from a group consisting of alumna, a silicon nitride, a silicon carbide, an aluminum nitride, a beryllium oxide, a boron nitride, diamond, diamond-like-carbon (DLC), Cu-clad invar, and glass-coated steel. The thermal conductive insulating layer may be configured to contact at least one of a bottom surface, a side surface and a top surface of the magnetic track.

The thermal conductive insulating layer may be formed on a substrate and the magnetic track may be formed on the thermal conductive insulating layer. A plurality of the magnetic tracks may be arranged on the thermal conductive insulating layer. The semiconductor device may further include another thermal conductive insulating layer covering at least one of a side surface and a top surface of the magnetic track. The current supply unit may include a transistor or a diode connected to at least one of both ends of the magnetic track.

The semiconductor device may further include a read/write unit writing data on the magnetic domains of the magnetic track and reading data from the magnetic domains. The read/write unit may include at least one of a first unit performing reading and a second unit performing writing; and a single unit performing both reading and writing.

BRIEF DESCRIPTION OF THE DRAWINGS

Example embodiments will be more clearly understood from the following detailed description taken in conjunction with the accompanying drawings.

FIG. 1 is a perspective view of a semiconductor device using magnetic domain wall movement according to example embodiments;

FIG. 2 is a cross-sectional view of a section of a semiconductor device according to example embodiments;

FIG. 3 is a cross-sectional view of a section of a semiconductor device according to the conventional art;

FIG. 4 is a graph illustrating a variation over time in the temperature of a magnetic track illustrated in FIGS. 2 and 3 when current may be supplied to the magnetic track; and FIG. 5 is a semiconductor device using magnetic domain wall movement according to example embodiments.

Figure 1:
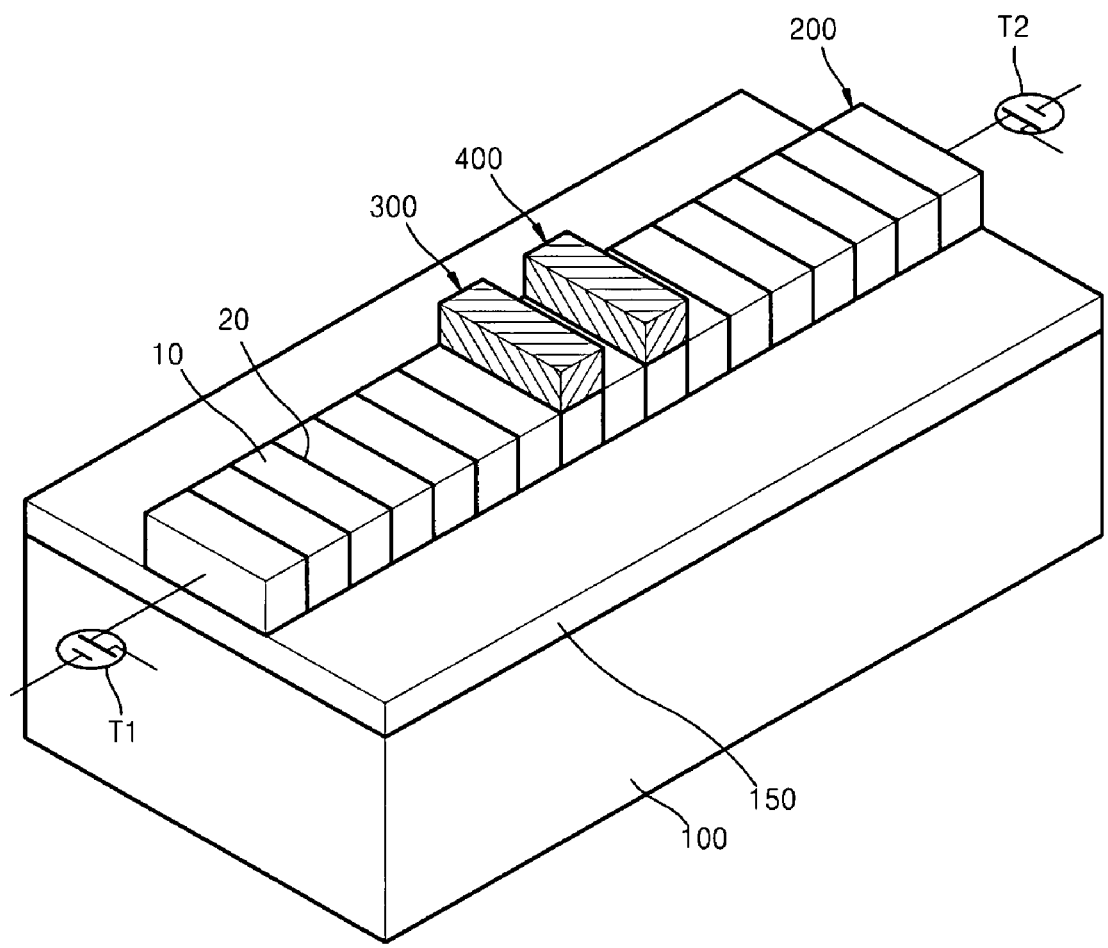
FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described more fully hereinafter with reference to the accompanying drawings, in which example embodiments are shown. Example embodiments may, however, be embodied in different forms and should not be construed as limited to example embodiments set forth herein. Rather, example embodiments are provided so that this disclosure will be thorough and complete, and will fully convey the scope of example embodiments to those skilled in the art. In the drawings, the thickness of layers and regions are exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a semiconductor device using magnetic domain wall movement according to example embodiments. Referring to FIG. 1, a thermal conductive insulating layer 150 may be formed on a substrate 100. The thermal conductivity k of the thermal conductive insulating layer 150 may be about $10 \leq k \leq 2000$ J/(s·m·K). For example, the thermal conductive insulating layer 150 may be formed of at least one of alumina, a silicon nitride, a silicon carbide, an aluminum nitride, a beryllium oxide, a boron nitride, diamond, DLC (diamond like carbon), Cu-clad invar, and glass-coated steel. Table 1 illustrates thermal conductivity k of the materials for the thermal conductive insulating layer 150 and a silicon oxide.

TABLE 1

| Material | thermal conductivity k [J/(s · m · K)] |
|---|---|
| Silicon oxide (SiO$_2$) | 1.4 |
| 92% alumina (Al$_2$O$_3$) | 18 |
| 96% alumina (Al$_2$O$_3$) | 20 |
| Silicon nitride (Si$_3$N$_4$) | 30 |
| Silicon carbide (SiC) | 270 |
| Aluminum nitride (AlN) | 230 |
| Beryllium oxide (BeO) | 240 |
| Boron oxide (BN) | 600 |
| Diamond (by high pressure CVD) | 2000 |
| Diamond (by plasma enhanced CVD) | 400 |
| Cu-clad invar | 100 |
| Glass-coated steel | 50 |

A magnetic track 200 may be formed on the thermal conductive insulating layer 150. In the magnetic track 200, at least two magnetic domains 10 may be arranged in series lengthwise along the magnetic track 200 and a magnetic domain wall 20 may be present between every two adjacent magnetic domains 10. A part of the magnetic track 200 may be used as a buffer track for temporarily storing data or instead, an additional buffer track (not shown) may be connected to the magnetic track 200. Although FIG. 1 illustrates the magnetic track 200 in a line, the magnetic track 200 may be formed having various shapes. For example, the magnetic track 200 may be formed to have a curved shape and/or may partly be a three-dimensional (3D) magnetic construction. Also, although not shown in FIG. 1, notches may be formed on a side of the magnetic track 200 as a pinning site of the magnetic domain wall 20.

Both ends of the magnetic track 200 may be respectively connected to a first transistor T1 and a second transistor T2. The first and second transistors T1 and T2 may be connected to a power supply source (not shown). The first and second transistors T1 and T2 and the power supply source connected to the first and second transistors T1 and T2 may form a device for supplying current to the magnetic track 200. The magnetic domains 10 and the magnetic domain walls 20 may be moved by supplying a predetermined or given amount of current to the magnetic track 200 by using the first and second transistors T1 and T2. The direction of the current may be changed by switching on or off the first and second transistors T1 and T2, and a direction in which the magnetic domains 10 and the magnetic domain walls 20 are moved depends on the direction of the current. The direction of the current may be opposite to the direction of electrons, and thus, the magnetic domains 10 and the magnetic domain walls 20 may be moved in a direction opposite to the direction of the current.

Both ends of the magnetic track 200 may not be connected to the first and second transistors T1 and T2 but instead, two transistors may be connected to one of the ends of the magnetic track 200. In example embodiments, the direction of the current supplied to the magnetic track 200 may be changed depending on whether one of the two transistors is switched on. A device for supplying the current to the magnetic track 200 may include a diode instead of the first and second transistors T1 and T2. For example, a diode may be connected to at least one of the ends of the magnetic track 200, but various devices may be used to supply the current to the magnetic track 200.

A read unit 300 and a write unit 400 may be installed on a predetermined or given location of the magnetic track 200. The read unit 300 may be either a giant magneto resistance (GMR) sensor using the GMR effect or a tunnel magneto resistance (TMR) sensor using the TMR effect. The write unit 400 may be a GMR or TMR recording device. The write unit 400 may be a device that performs writing by using an external magnetic field. In example embodiments, the write unit 400 may be spaced a predetermined or given distance from the magnetic track 200. The reading and writing mechanism, constructions and locations of the read unit 300 and write unit 400 may not be limited to the above description and may be variously determined. For example, a single read/write unit that performs both reading and writing functions may be used instead of the read unit 300 and the write unit 400.

Reading or writing data by using the read unit 300 or the write unit 400 may be possible while moving the magnetic domains 10 and the magnetic domain walls 20 in units of bits by supplying current to the magnetic track 200 with the first and second transistors T1 and T2. In example embodiments, heat may be generated in the magnetic track 200 due to the current, and the heat may be more easily conducted to the substrate 100 via the thermal conductive insulating layer 150. Because the thermal conductive insulating layer 150 has improved thermal conductivity and a top surface of the thermal conductive insulating layer 150 is greater than a bottom surface of the magnetic track 200, the heat generated in the magnetic track 200 may be more easily conducted to the entire thermal conductive insulating layer 150. The heat conducted to the thermal conductive insulating layer 150 may be conducted to the substrate 100 and dissipate to either an external material (not shown) facing the substrate 100 or into the atmosphere. Accordingly, in a semiconductor using magnetic domain wall movement according to example embodiments, preventing or reducing the magnetic track 200 from being heated due to a current supplied thereto may be possible.

Figure 2:
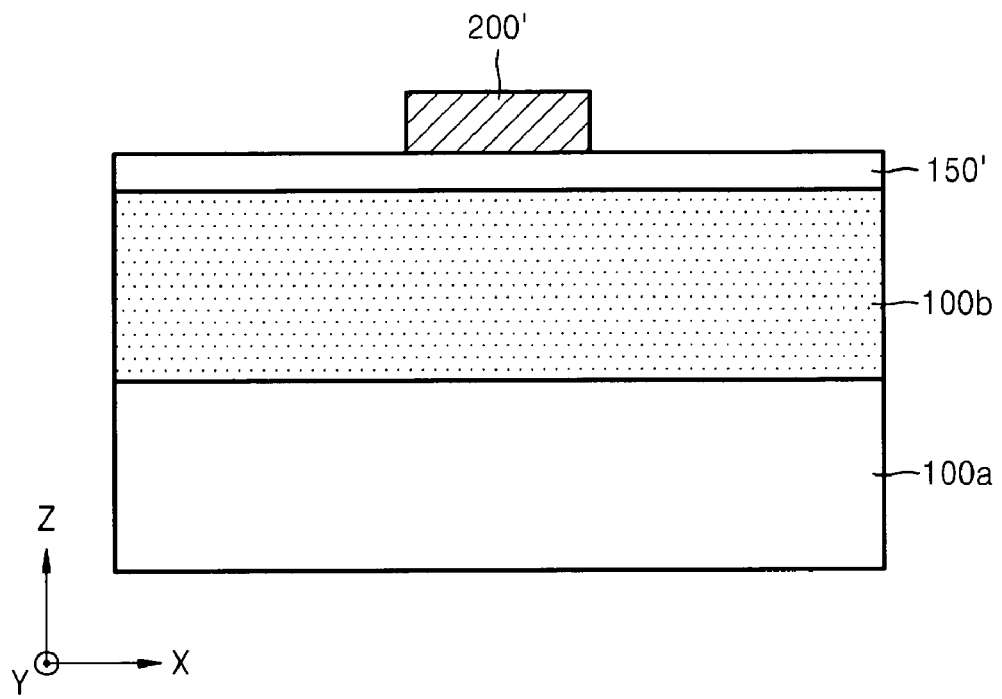
Figure 3:
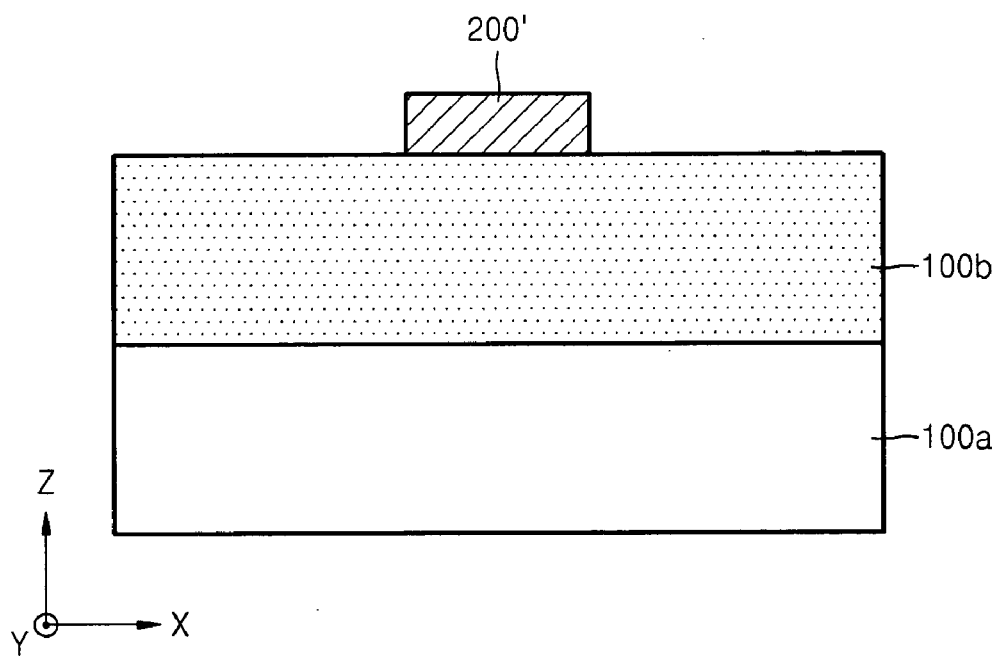

FIG. 2 is a cross-sectional view of a section of a semiconductor device manufactured according to example embodiments. FIG. 3 is a cross-sectional view of a section of a semiconductor device manufactured according to the conventional art. Referring to FIG. 2, the section of example embodiments may have a stacked structure in which a silicon oxide layer 100b, a thermal conductive insulating layer 150' and a magnetic track 200' are sequentially deposited on a silicon substrate 100a. The thermal conductive insulating layer 150' may be formed of an aluminum nitride (AlN) and the magnetic track 200' may be formed of cobalt (Co). The silicon substrate 100a, the silicon oxide layer 100b, the thermal conductive insulating layer 150', and the magnetic track 200' may be respectively formed to thicknesses of about 1000 nm, about 500 nm, about 100 nm and about 20 nm. The widths of the silicon substrate 100a and the magnetic track 200 may be respectively about 5,000 nm and about 100 nm in the X-axis direction, and the lengths of the silicon substrate 100a and the magnetic track 200' may be several μm in the Y-axis direction.

Figure 4:
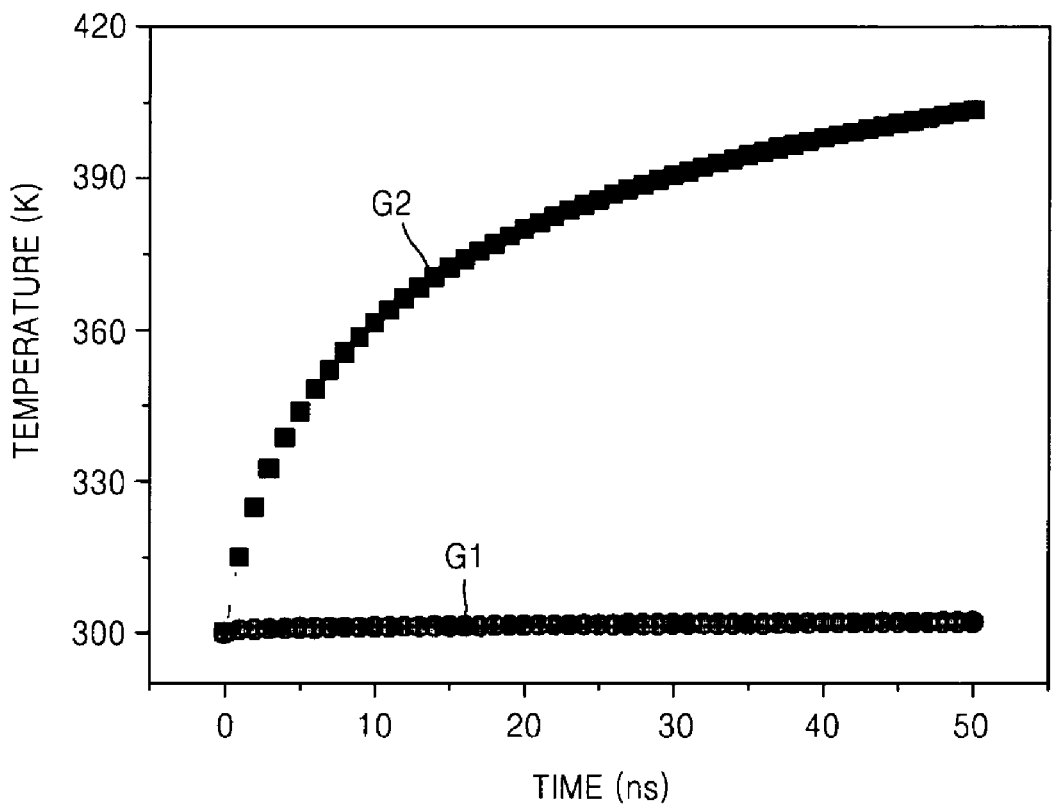

The conventional art section illustrated in FIG. 3 may have the same construction as the section according to example embodiments and illustrated in FIG. 2 except for the thermal conductive insulating layer 150' of FIG. 2. In other words, in the conventional art section, a magnetic track 200' may be directly formed on a silicon oxide layer 100b without a thermal conductive insulating layer. Initial temperatures of the first and second sections were set at about 300 K and a change over time in the temperatures of the magnetic tracks 200' of the respective first and second samples were measured while supplying current to the magnetic tracks 200'. The measuring result may be illustrated in FIG. 4. Referring to FIG. 4, a first graph G1 corresponds to the section according to example embodiments illustrated in FIG. 2 and a second graph G2 corresponds to the second section according to example embodiments illustrated in FIG. 3.

Referring to FIG. 4, the first graph G1 may be almost a horizontal line which means the temperature of the magnetic track 200' in the section according to example embodiments having the thermal conductive insulating layer 150' changes only slightly over time. The second graph G2 shows that the temperature of the magnetic track 200' in the conventional art section having no thermal conductive insulating layer rapidly increases over time. For example, the magnetic track 200' of the conventional art section was heated to about 400 K in about 50 ns. Referring to FIG. 4, use of the thermal conductive insulating layer 150' may effectively prevent or reduce the magnetic track 200' from being heated. Thus, in a semiconductor device using magnetic domain wall movement according to example embodiments, various problems due to heating of a magnetic track may be solved. Accordingly, manufacturing a semiconductor device with relatively stable operation and improved data retention capabilities may be possible.

A semiconductor device using magnetic domain wall movement according to example embodiments may have various structures. For example, in FIG. 1, the thermal conductive insulating layer 150 may be located on a side surface and/or a top surface of the magnetic track 200. Also, a plurality of the magnetic tracks 200 may be formed on the thermal conductive insulating layer 150 of FIG. 1 and the magnetic track 200 may have a multi-layered structure.

Figure 5:
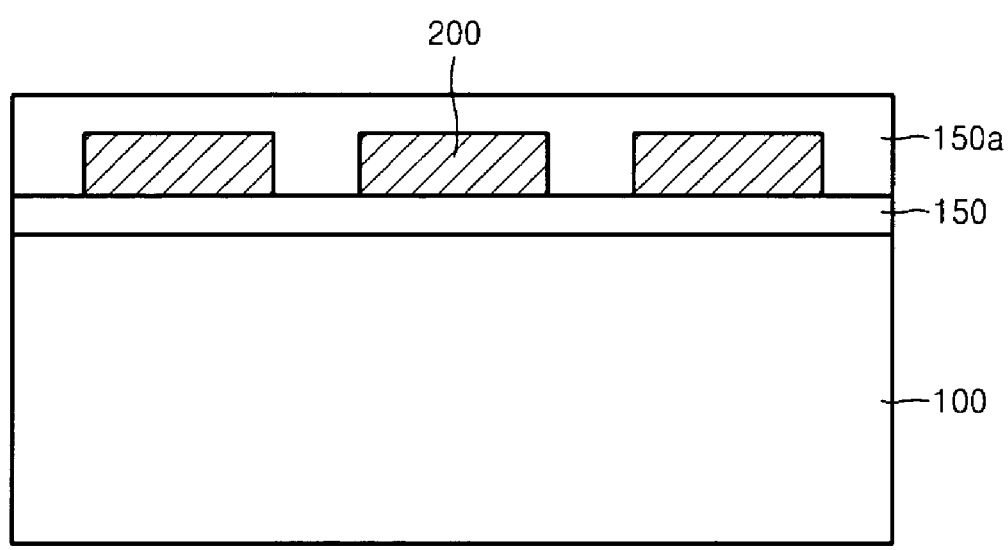

FIG. 5 is a semiconductor device using magnetic domain wall movement according to example embodiments. Referring to FIG. 5, a plurality of magnetic tracks 200 may be formed on a first thermal conductive insulating layer 150, and a second thermal conductive insulating layer 150a may be formed to cover the gaps between the magnetic tracks 200 and the top surfaces of the magnetic tracks 200. The second thermal conductive insulating layer 150a may be identical to the first thermal conductive insulating layer 150. If each of the magnetic tracks 200 may be surrounded by both the first and second thermal conductive insulating layers 150 and 150a, the magnetic tracks 200 may be more effectively prevented or reduced from being heated.

It should be understood that these example embodiments should be considered in a descriptive sense only and not for purposes of limitation. Descriptions of features or aspects within each embodiment should typically be considered as available for other similar features or aspects in the remaining embodiments. For example, it would be apparent to those of ordinary skill in the art that the ideas of the above example embodiments may be applied to not only an information storage device (memory) as illustrated in FIG. 1 but also to various applications using magnetic domain wall movement.

Thus, although a few example embodiments may have been shown and described, it would be appreciated by those of ordinary skill in the art that changes may be made in these example embodiments without departing from the principles and spirit of example embodiments, the scope of which may be defined in the claims and their equivalents.

What is claimed is:

1. A semiconductor device comprising:
a thermal conductive insulating layer;
a magnetic track formed on a surface of the thermal conductive insulating layer, the magnetic track having a plurality of magnetic domains, where a magnetic domain wall is present between adjacent magnetic domains; and
a current supply unit configured to supply current to the magnetic track to move the magnetic domains and the magnetic domain walls;
wherein the magnetic track is disposed between the thermal conductive insulating layer and a unit configured to at least one of read and write data.

2. The semiconductor device of claim 1, wherein thermal conductivity k of the thermal conductive insulating layer is about $10 \leq k \leq 2000$ J/(s·m·K).

3. The semiconductor device of claim 1, wherein the thermal conductive insulating layer is formed of at least one chosen from a group consisting of alumina, a silicon nitride, a silicon carbide, an aluminum nitride, a beryllium oxide, a boron nitride, diamond, diamond-like-carbon (DLC), Cu-clad invar, and glass-coated steel.

4. The semiconductor device of claim 1, further comprising:
another thermal conductive insulating layer configured to contact at least one of a side surface and a top surface of the magnetic track.

5. The semiconductor device of claim 1, wherein the thermal conductive insulating layer is on a substrate.

6. The semiconductor device of claim 5, wherein a plurality of the magnetic tracks are arranged on the thermal conductive insulating layer.

7. The semiconductor device of claim 5, further comprising:
another thermal conductive insulating layer configured to cover at least one of a side surface and a top surface of the magnetic track.

8. The semiconductor device of claim 5, wherein the current supply unit comprises a transistor or a diode connected to at least one of both ends of the magnetic track.

9. The semiconductor device of claim 1, wherein the unit comprises:
a read/write unit configured to write data on the magnetic domains of the magnetic track and configured to read data from the magnetic domains.

10. The semiconductor device of claim 9, wherein the read/write unit comprises at least one of:
a first unit configured to perform reading and a second unit configured to perform writing; and
a single unit configured to perform both reading and writing.

11. The semiconductor device of claim 1, wherein the thermal conductive insulating layer is configured to dissipate heat generated in the magnetic track by the applied current.

12. The semiconductor device of claim 11, wherein the magnetic track is formed on an upper surface of the thermal conductive insulating layer.

13. The semiconductor device of claim 1, wherein an insulating layer is formed on a substrate, and the thermal conductive insulating layer is formed on the insulating layer.

14. A semiconductor device comprising:
a thermal conductive insulating layer formed on a surface of a substrate;
a magnetic track formed on a surface of the thermal conductive insulating layer, the magnetic track having a plurality of magnetic domains, where a magnetic domain wall is present between adjacent magnetic domains; and
a current supply unit configured to supply current to the magnetic track to move the magnetic domains and the magnetic domain walls;
wherein a length of the substrate is substantially larger than a distance between adjacent magnetic domain walls.

15. The semiconductor device of claim 14, wherein a thermal conductivity k of the thermal conductive insulating layer is about $10 \leq k \leq 2000$ J/(s·m·K).

16. The semiconductor device of claim 14, wherein the thermal conductive insulating layer is formed of at least one chosen from a group consisting of alumina, a silicon nitride, a silicon carbide, an aluminum nitride, a beryllium oxide, a boron nitride, diamond, diamond-like-carbon (DLC), Cu-clad invar, and glass-coated steel.

17. The semiconductor device of claim 14, wherein the thermal conductive insulating layer is configured to contact at least one of a bottom surface, a side surface and a top surface of the magnetic track.

18. The semiconductor device of claim 14, wherein a plurality of the magnetic tracks are arranged on the thermal conductive insulating layer.

19. The semiconductor device of claim 14, further comprising:
a read/write unit configured to write data on the magnetic domains of the magnetic track and configured to read data from the magnetic domains.

20. The semiconductor device of claim 14, wherein the thermal conductive insulating layer has a width greater than that of the magnetic track.

* * * * *